(12) United States Patent
Sobolewski et al.

(10) Patent No.: US 7,782,043 B1
(45) Date of Patent: Aug. 24, 2010

(54) VARIABLE BANDWIDTH DC BIAS FOR AC MEASUREMENT SYSTEM

(75) Inventors: Gregory Sobolewski, Seven Hills, OH (US); Wayne C. Goeke, Hudson, OH (US)

(73) Assignee: Keithly Instruments, Inc., Cleveland, OH (US)

( * ) Notice: Subject to any disclaimer, the term of this patent is extended or adjusted under 35 U.S.C. 154(b) by 348 days.

(21) Appl. No.: 11/760,226

(22) Filed: Jun. 8, 2007

(51) Int. Cl.
*G01R 31/26* (2006.01)
*G05B 13/02* (2006.01)

(52) U.S. Cl. .................. 324/76.11; 324/765; 700/46
(58) Field of Classification Search .............. 324/76.11, 324/765; 700/46; 702/75, 107; 375/224–227, 375/319, 344–345; 455/67.11, 423, 115.1, 455/226.1
See application file for complete search history.

(56) References Cited

U.S. PATENT DOCUMENTS

| 4,727,337 A * | 2/1988 | Jason ..................... 330/298 |
| 6,054,867 A * | 4/2000 | Wakamatsu ................ 324/650 |
| 6,282,206 B1 * | 8/2001 | Hindus et al. ............... 370/468 |

OTHER PUBLICATIONS

Efficient Microwave Bias and Testing Using teh HP 4142B Modular DC Source/Monitor, Hewlett Packard. Application Note 1205. Copyright 1991.*
Efficient Microwave Bias and Testing Using the HP 4142B Modular DC Source/Monitor. Hewlett Packard. Application Note 1205 (Date: At least as early as Aug. 30, 2006.).

* cited by examiner

*Primary Examiner*—Timothy J Dole
*Assistant Examiner*—Farhana Hoque
(74) *Attorney, Agent, or Firm*—Pearne & Gordon LLP

(57) ABSTRACT

A method for controlling a measurement system includes providing a variable bandwidth DC bias loop for biasing a DUT; providing an AC measurement loop for measuring AC parameters of the DUT; disabling the AC measurement loop and selecting a high bandwidth for the DC bias loop when rapid changes to the DC bias are to be made; and selecting a low bandwidth for said DC bias loop and enabling the AC measurement loop when AC measurements of the DUT are to be made.

1 Claim, 1 Drawing Sheet

VARIABLE BANDWIDTH DC BIAS FOR AC MEASUREMENT SYSTEM

BACKGROUND OF THE INVENTION

The present invention relates to electrical measurements and, in particular, to closed loop measurement systems.

It has become ubiquitous to use feedback loops in measurement systems to ensure that signals (e.g., current, voltage) impressed on a device under test (DUT) are the desired signal and not some approximation caused by such factors as cable losses, stray impedances and interference coupling.

Historically, DC measurements and AC measurements (e.g., LF, pulse and RF) measurements were made separately on a DUT. Increasingly, the market is demanding that these measurements be integrated.

Establishing a known DC bias on a DUT is complicated by the fact that the AC measurement will likely try to make the DC bias "move". In these cases, the AC loop and the DC loop may "fight" each other. This is particularly the case where it is desired to quickly establish bias levels. By minimizing settling times, measurement throughput can be maximized; however, this increases the likelihood that the DC and AC feedback loops will conflict.

SUMMARY OF THE INVENTION

A method for controlling a measurement system includes providing a variable bandwidth DC bias loop for biasing a DUT; providing an AC measurement loop for measuring AC parameters of the DUT; disabling the AC measurement loop and selecting a high bandwidth for the DC bias loop when rapid changes to the DC bias are to be made; and selecting a low bandwidth for said DC bias loop and enabling the AC measurement loop when AC measurements of the DUT are to be made.

DESCRIPTION OF THE PREFERRED EMBODIMENTS

Figure 1:
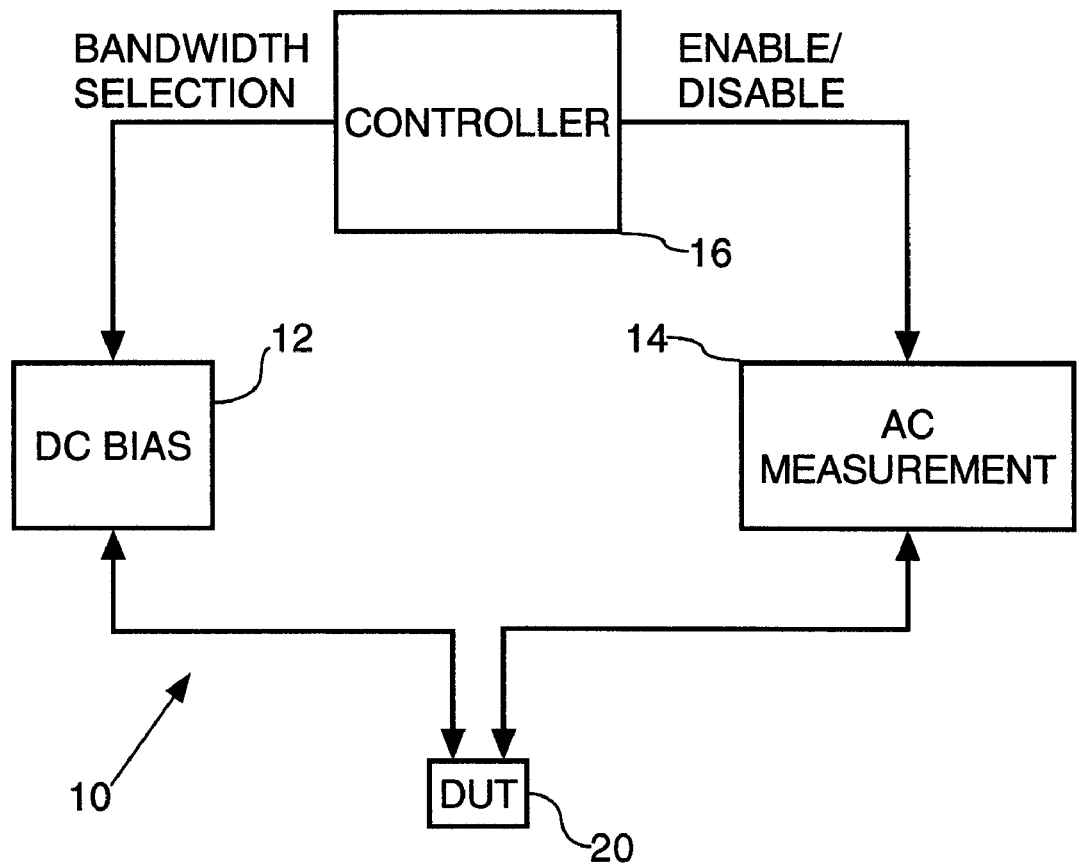
FIG. 1 is block diagram of an example of a measurement system for the performing a method according to an aspect of the invention.

Referring to FIG. 1, a measurement system 10 includes a DC bias section 12, an AC measurement section 14 and a controller 16. The measurement system 10 is used to test a DUT 20.

The DC bias section 12 has a variable bandwidth bias loop that connects to the DUT 20 to establish desired bias on the DUT 20. For example, such known devices as source measure units may be employed. The AC measurement section 14 has an AC measurement loop that connects to the DUT 20 for applying desired signals to the DUT 20 to measure AC parameters (e.g., voltage, current, impedance) of the DUT 20. For example, such known devices as LCR meters may be used.

The controller 16 controls the operation of the sections 12, 14. The controller 16 may be, for example, a FPGA, a dedicated microprocessor-based system, a microcontroller or a networked general purpose computer.

When a rapid change to the DC bias of the DUT 20 is desired (i.e., one that would cause the AC measurement loop to interfere with the DC bias loop), the controller 12 disables the AC measurement loop and selects a high bandwidth for the DC bias loop. When AC measurements of the DUT 20 are desired, the controller 12 enables the AC measurement loop and selects a low bandwidth for the DC bias loop. For example, the high bandwidth selection may be orders of magnitude greater than the low bandwidth selection.

Operation in accordance with this method results in the ability to handle fast DC steps while handling AC measurements without a significant decrease in measurement throughput.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for controlling a measurement system, said method comprising:
   providing a variable bandwidth DC bias loop for biasing a DUT, said DC bias loop having at least a high bandwidth value and a low bandwidth value, said values being at least two orders of magnitude different;
   providing an AC measurement loop for measuring AC parameters of said DUT;
   disabling said AC measurement loop and selecting said high bandwidth value for said DC bias loop when rapid changes to the DC bias are to be made; and
   selecting said low bandwidth value for said DC bias loop and enabling said AC measurement loop when AC measurements of the DUT are to be made.

* * * * *